United States Patent [19]

Mateika et al.

[11] Patent Number: 4,687,646

[45] Date of Patent: Aug. 18, 1987

[54] COLD CRUCIBLE FOR MELTING AND CRYSTALLIZING NON-METALLIC INORGANIC COMPOUNDS

[75] Inventors: Werner D. Mateika, Ellerbek; Rolf Laurien, Pinneberg; Manfred R. Liehr, Hamburg, all of Fed. Rep. of Germany

[73] Assignee: U.S. Philips Corporation, New York, N.Y.

[21] Appl. No.: 606,019

[22] Filed: May 2, 1984

[30] Foreign Application Priority Data

May 6, 1983 [DE] Fed. Rep. of Germany ....... 3316546

[51] Int. Cl.$^4$ .............................................. B01D 9/00
[52] U.S. Cl. ........................... 422/248; 156/DIG. 83; 219/422; 422/249
[58] Field of Search ............................. 422/248, 249; 156/616 R, DIG. 83, 617 M, 617 SP; 219/420, 422, 10.67, 10.49 R; 373/156; 266/242; 432/242, 246; 164/335; 249/79, 160; 425/441, 443

[56] References Cited

U.S. PATENT DOCUMENTS

| 2,517,001 | 8/1950 | Lewon et al. | 425/443 X |
| 2,852,420 | 9/1958 | Pohl | 156/617 SP |
| 3,273,969 | 9/1966 | Sirgo | 422/248 |
| 3,414,387 | 12/1968 | Syosoev et al. | 422/248 |
| 3,461,215 | 8/1969 | Reboux | 373/156 |
| 3,824,302 | 7/1974 | Alexandrov et al. | 156/620.5 |
| 4,049,384 | 9/1977 | Wenckus et al. | 156/617 SP X |
| 4,160,796 | 7/1979 | Lirones | 266/242 |
| 4,203,951 | 5/1980 | Goriletsky et al. | 422/249 |
| 4,224,100 | 9/1980 | Hartzell | 156/617 M |
| 4,256,530 | 3/1981 | Schmid et al. | 156/DIG. 83 |
| 4,371,419 | 2/1983 | Fukuda et al. | 156/DIG. 83 X |

FOREIGN PATENT DOCUMENTS

| 2712128 | 9/1978 | Fed. Rep. of Germany | 432/262 |
| WO80/01489 | 7/1980 | PCT Int'l Appl | 422/248 |

OTHER PUBLICATIONS

Hawley; The Condensed Chemical Dictionary, 10th edit.; Van Nostrand Reinhold Co. 1981, p. 895.

Primary Examiner—Barry S. Richman
Assistant Examiner—Michael S. Gzybowski
Attorney, Agent, or Firm—Norman N. Spain

[57] ABSTRACT

A cold crucible for melting and crystallizing non-metallic inorganic compounds having a cooled crucible wall in the form of metal pipes through which cooling medium flows which are in mechanical connection with the bottom of the crucible through which cooling medium also flows, and having an induction coil which surrounds the wall of the crucible and via which high frequency energy can be coupled in the contents of the crucible and having a second induction coil which can be controlled independently of the induction coil surrounding the wall of the crucible and which is provided below the bottom of the crucible, and having a crucible bottom consisting of a dielectric material.

3 Claims, 1 Drawing Figure

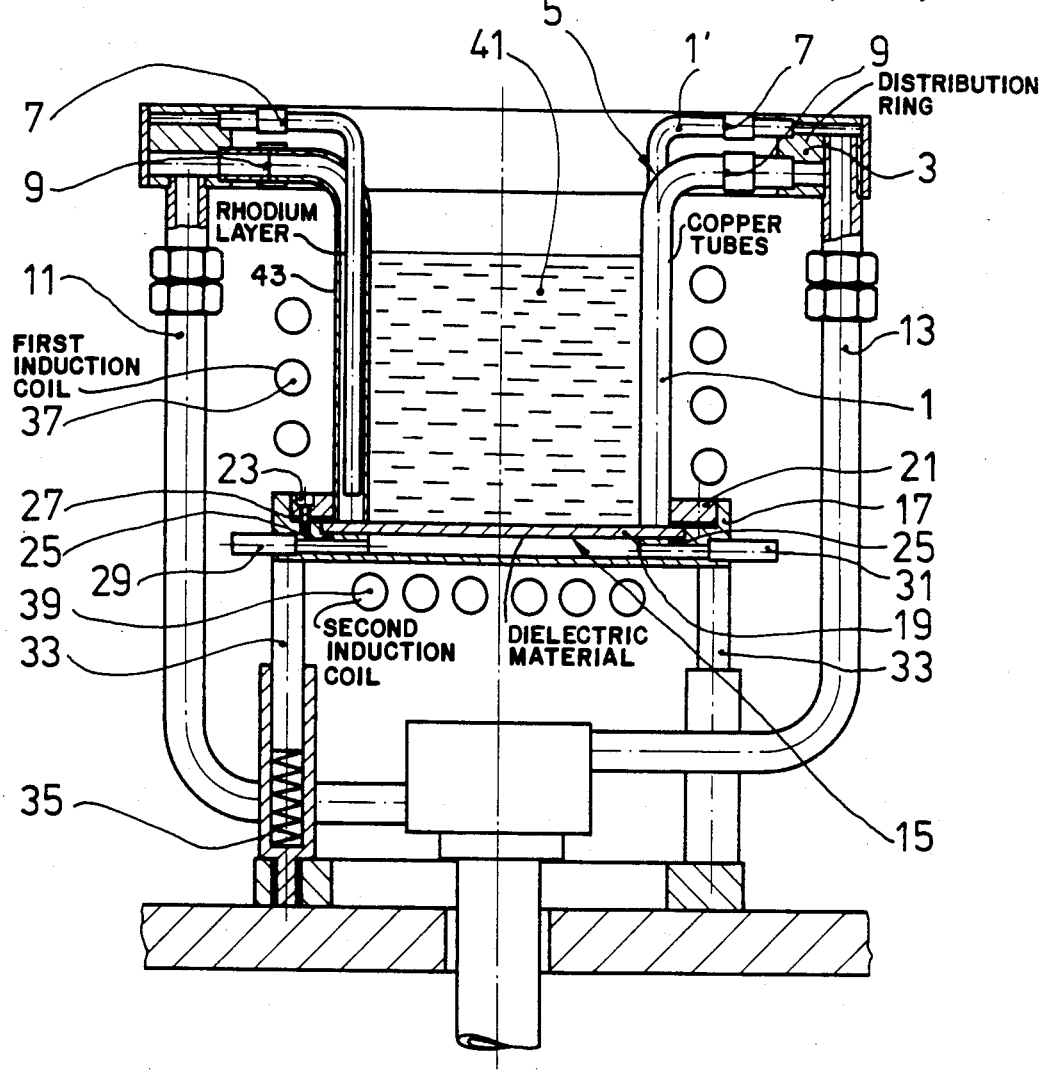

COLD CRUCIBLE FOR MELTING AND CRYSTALLIZING NON-METALLIC INORGANIC COMPOUNDS

FIELD OF THE INVENTION

The invention relates to a cold crucible for melting and crystallizing non-metallic inorganic compounds by means of high-frequency energy.

BACKGROUND OF THE INVENTION

Poorly conducting oxides must first be preheated. For this purpose, according to U.S. Pat. No. 4,224,100 pieces of a metal which corresponds to that of the oxide to be melted are used and are embedded in the powdered oxide. On the basis of the induced eddy currents the applied electromagnetic field first heats the pieces of metal which in turn melt the oxide powder in the immediate proximity. In the forming melt the field of the high frequency coil can directly couple-in due to the higher electric conductivity of the melt. By increasing the high frequency power further oxide powder is continuously melted until melt has formed in the proximity of the crucible wall. A water-cooled inner crucible surface ensures that between it and the hot melt a densely sintered specific layer which is in a solid state is formed which protects the crucible from attack by the melt. The melt used for the preheating is converted into the oxide to be melted by oxygen from the air.

It has now been found that perfect crystals cannot be grown by means of this known crucible. By slowly cooling the melt, single crystals, up to a few centimeters large, can grow spontaneously on the bottom and wall of the crucible and hinder each other during the growth. The results are considerable mechanical stresses and other crystal defects.

SUMMARY OF THE INVENTION

It is the object of the invention to construct a cold crucible in which the crystallisation can be performed directly and mechanical stresses in the crystal and other crystal defects are reduced.

According to the invention this object is achieved by having a second induction coil which can be switched independently of the induction coil surrounding the crucible wall provided below the crucible bottom and by having the bottom of the crucible consisting of a dielectric material.

The invention is based on the recognition of the fact that the growth conditions for crystals to be grown from the melt can be improved by means of a cold crucible in which a direct influencing of the temperature distribution in the melt is possible, this when the temperature gradient in the melt can be adjusted. It should be noted that when it was tried to perform a separate heating of the starting materials to be melted in a crucible which consisted entirely of metal, the heating starting from the bottom of the crucible by a second separately switchable induction coil below the bottom of the crucible, experiments did not produce the desired result. The invention is therefore furthermore based on the recognition of the fact that the important electric losses in the metallic crucible bottom could be a reason for the failure.

BRIEF DESCRIPTION OF THE DRAWING

The sole FIGURE in the drawing is a sectional view of a cold crucible of the invention.

DETAILED DESCRIPTION OF THE INVENTION

According to an advantageous embodiment of the invention the bottom of the crucible consists of a plate, preferably of quartz, below which cooling medium flows and which plate is incorporated in a holder which is connected to spring journalled supports. Since the supports are spring journalled the advantage is obtained that the expansion of the melt upon heating is compensated for so that a destruction of the quartz plate which may occur in supports which do not compensate for a thermal expansion of the contents of the crucible is avoided. Since the forces of expansion in the vertical direction in the melting process can be compensated for the greater part by the resilient bearing of the crucible bottom, the life of the crucible can be considerably extended.

According to a further advantageous embodiment of the invention the metal pipes forming the wall of the crucible are mechanically journalled by means of at least one distributor ring, the distributor ring being movable vertically by means of a driving device. This has for its advantage that the crucible, after the finished crystallisation process, can be emptied in a simple manner in that the upper part of the crucible, the wall of the crucible, can be lifted from the bottom of the crucible and the crystal or crystals can be pushed downwards out of the open cylinder.

Since the bottom of the crucible which is cooled, for example, by water, consists only of dielectric materials, the advantage is obtained that no electric losses in the bottom of the crucible occur when heating is carried out inductively from the bottom.

Since two individually switchable induction coils are used, the advantage is obtained that the quantity of energy to be coupled in the contents of the crucible becomes locally dosable, so energy of different frequencies may be used, as may be desired, in which, for example, both a high frequency generator and an intermediate frequency generator alone or both generators simultaneously may be used for heating the contents of the crucible. It may be advantageous to achieve a locally different heating of the contents of the crucible not only via the two individually switchable induction coils, but to provide auxiliary members of an electrically readily conducting material which is inert with respect to the melt inside the crucible, for example, via the bottom of the crucible, which members can rapidly and directly be heated by the electromagnetic field on the basis of induced eddy currents.

An embodiment of the invention will now be described in greater detail with reference to the drawing.

The sole FIGURE in the drawing is a sectional view of a cold crucible according to the invention. The walls of the crucible consist of double walled metal pipes, for example, of copper, which are bent at right angles and which are arranged in a circle and through which cooling medium flows, for example, water. The pipes 1 are spaced 0.3 mm from each other, have an outside diameter of 10 mm and are sealed at the bottom. The upper ends of the pipes are soldered in a distributor ring 3 which serves for the supply of cooling medium. An inner pipe 1' opens into the outer pipe 1 at the area of a knee 5 and is also connected to the distributor ring 3 via a bend. The connection of the pipes 1 and 1' is done by means of soldered joints 7 and 9; said soldered joints 7 and 9 allow of rapid and simple replacement pipes 1 and 1' in the case of defects. The distributor ring 3 with the pipes 1, 1' is connected to several inlets and outlets 11 and 13 for the cooling medium. It is advantageous to provide the pipes 1 with a protective layer for protection against oxidation. The the case of copper pipes an approximately 6 μm thick rhodium layer 43 has proved suitable.

The bottom 15 of the crucible consists of a supporting basic member 17 of a dielectric material, a plate 19 of a dielectric material which is inert with respect to the melt, for example quartz, and a holder ring 21 likewise of a dielectric material. For example $Al_2O_3$. The basic member 17 may consist of a heat resistant synthetic resin and has recesses for receiving the plate 19 and the holder ring 21, the holding holder ring 21 being rigidly connected to the basic member 17, for example, via screws 23 of, for example, nylon; by a screwed joint it is possible to urge the plate 19 on an O-ring 25 which serves as a seal against the cooling medium. In order to reduce local mechanical stresses between the holder ring 21 and the plate 19, an elastic ring 27, for example of tetrafluoroethylene, is provided between these two parts. Connections 29 and 31 serve as inlet and outlet apertures, respectively, for the cooling medium. The bottom 15 of the crucible is connected to supports 33 which are spring journalled with spring 35. The springs 35 have for their object to compensate for the expansion of a melt present in the crucible during heating so that destruction of the plate 19 is avoided. By means of a mechanical driving device not shown the distributor ring 3 with the pipes 1, 1' can be moved in a vertical direction, can hence be moved upwardly in the direction away from the bottom 15 of the crucible or can be lowered in the direction of said bottom. The cold crucible described in this example has an inside diameter of 121 mm, the maximum filling height is 120 mm. An induction coil 37 is provided around the wall of the crucible consisting of the pipes 1. Said coil is connected to a generator whose operating frequency is between 1 and 7 mHz. A further induction coil 39 which is operated with a generator of the same operating frequency as or an operating frequency different from that for the generator connected to the induction coil 37, is provided below the bottom 15 of the crucible. The generator connected to the induction 39, for example, has an operating frequency of 7 to 10 kHz. Both generators may be switched independently of each other.

For actuating the crucible, the distributor ring with the pipes 1, 1' is provided on the inlets and outlets 11 and 13 of the cooling means is tightened, and is moved against the spring journalled bottom 15 of the crucible by means of the driving device. The holder ring 21 surrounds the pipes 1 and gives the crucible an additional stability against bending of the pipes 1. After completion of the melting and crystallisation process, respectively, the wall of the crucible formed by the pipes 1 is moved upwards away from the bottom 15 of the crucible. The crystallised contents of the crucible can then very easily be pushed out downwardly of the open cylinder. In the FIGURE the contents of the crucible are represented as the melt 41.

What is claimed is:

1. In a cold crucible for melting and crystallizing non-metallic inorganic compounds, said crucible having a cooled crucible wall comprising metal pipes through which pipes cooling liquid may flow and which pipes are coupled to the bottom of the crucible through which bottom cooling liquid may also flow, and having a first induction coil surrounding the wall of the crucible by which first induction coil high-frequency energy can be applied to the contents of the crucible, wherein the improvement comprises a second induction coil which can be controlled independently of the first induction coil surrounding the wall of the crucible is positioned below the bottom of the crucible, the metal pipes comprising the wall of the crucible are mechanically joined to at least one distributor ring, which distributor ring is movable vertically so as to raise and lower the wall of the crucible, the bottom of the crucible comprises a plate which is vertically displaceable from the wall of the crucible, which plate consists of a dielectric material and below which plate cooling liquid may flow and which plate is held in a holder which holder is connected to a plurality of spring journalled supports.

2. In a cold crucible for melting and crystallizing non-metallic inorganic compounds, said crucible having a cooled crucible wall comprising metal pipes through which pipes cooling liquid may flow and which pipes are mechanically coupled to the bottom of the crucible through which bottom cooling liquid may also flow, and having a first induction coil surrounding the wall of the crucible by which first induction coil high-frequency energy can be applied to the contents of the crucible, the improvement wherein a second induction coil which can be controlled independently of the first induction coil surrounding the wall of the crucible is positioned below the bottom of the crucible, the bottom of the crucible comprises a plate consisting of a dielectric material below which cooling liquid may flow and which plate is held in a holder which holder is vertically displaceable from the wall of the crucible and which holder is connected to spring journalled supports.

3. A cold crucible as claimed in claim 2 wherein the improvement further comprises said plate comprising the bottom of the crucible consists of quartz.

* * * * *